(12) United States Patent
Lin et al.

(10) Patent No.: US 9,654,127 B1
(45) Date of Patent: May 16, 2017

(54) METHOD FOR ADAPTIVELY REGULATING CODING MODE AND DIGITAL CORRECTION CIRCUIT THEREOF

(71) Applicant: REALTEK SEMICONDUCTOR CORP., Hsinchu (TW)

(72) Inventors: Sheng Hsiung Lin, Tainan (TW); Shih-Hsiung Huang, Miaoli County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 15/356,478

(22) Filed: Nov. 18, 2016

(30) Foreign Application Priority Data

Nov. 25, 2015 (TW) .............................. 104139157 A

(51) Int. Cl.
*H03M 1/06* (2006.01)
*H03M 1/44* (2006.01)

(52) U.S. Cl.
CPC .............. *H03M 1/06* (2013.01); *H03M 1/442* (2013.01)

(58) Field of Classification Search
CPC .......... H03M 1/06; H03M 1/442; H03M 1/38; H03M 1/40; H03M 1/403; H03M 1/46; H03M 1/462

USPC .......................................... 341/118, 163, 172
See application file for complete search history.

(56) References Cited

U.S. PATENT DOCUMENTS 8,164,504 B2 * 4/2012 Cho .................... H03M 1/0678
341/118
8,451,151 B2 * 5/2013 Lin ..................... H03M 1/1061
341/110

OTHER PUBLICATIONS

Chun-Cheng Liu, "A 10-bit 320-MS/s Low-Cost SAR ADC for IEEE 802.11ac Applications in 20-nm CMOS", IEEE Asian Solid-State Circuits Conference, Nov. 10-12, 2014/Kaohsiung, Taiwan.
Jon Guerber, et al., A 10-b Ternary SAR ADC With Quantization Time Information Utilization, IEEE Journal of Solid-State Circuits, pp. 2604-2613, vol. 47, No. 11, Nov. 2012.

* cited by examiner

*Primary Examiner* — Khai M Nguyen
(74) *Attorney, Agent, or Firm* — Li & Cai Intellectual Property (USA) Office

(57) ABSTRACT

A method for adaptively regulating a coding mode and a digital correction circuit thereof are provided. The method is for a successive-approximation-register analog-to-digital converter (SAR ADC). In the method, whether to regulate a binary weight corresponding to each of digital bits is determined according to the number of completed comparison cycles to provide a first coding sequence. The first coding sequence is directly compensated according to uncompleted comparison cycles to provide a correct digital output code.

10 Claims, 6 Drawing Sheets

US 9,654,127 B1

METHOD FOR ADAPTIVELY REGULATING CODING MODE AND DIGITAL CORRECTION CIRCUIT THEREOF

BACKGROUND

1. Technical Field

The present disclosure generally relates to a method for adaptively regulating a coding mode and a digital correction circuit thereof and, more particularly, to a method for adaptively regulating a coding mode and a digital correction circuit thereof for a successive-approximation-register analog-to-digital converter (SAR ADC).

2. Description of Related Art

Conventionally, a SAR ADC uses a binary search algorithm to acquire a digital output code matched with the input analog signal. During the conversion process, the digital-to-analog converter (DAC) circuit of the SAR ADC generally adds/subtracts a binary ratio voltage to/from a reference voltage based on each of the comparison results of the comparator until the difference between the input signal and the reference voltage becomes smaller than a least significant bit (LSB) after a final required comparison cycle is completed.

However, the conversion time of the SAR ADC may vary under different process-voltage-temperature (PVT) variations. For example, if the PVT variations shorten the conversion time, the SAR ADC fails to complete the final required comparison cycle within a given time period. In other words, the actual number of completed comparison cycles is smaller than an expected value, resulting in an incorrect output result.

In view of this, there is a need for overcoming the problem of the conversion time of a SAR ADC varying due to PVT variations, in order to obtain a correct output result even with different numbers of completed comparison cycles.

SUMMARY

The present disclosure provides a method for adaptively regulating a coding mode and a digital correction circuit thereof. The method is for a successive-approximation-register analog-to-digital converter (SAR ADC). In the method, whether to regulate a binary weight corresponding to each of the digital bits is determined according to the number of completed comparison cycles to obtain a first coding sequence. The first coding sequence is directly compensated according to uncompleted comparison cycles to output a correct digital output code. Thereby, under different PVT variations, the SAR ADC effectively eliminates the conversion time variations due to PVT variations in order to obtain a correct output result even with different numbers of completed comparison cycles.

In order to further understand the techniques, means and effects of the present disclosure, the following detailed descriptions and appended drawings are hereby referred to, such that, and through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

The detailed description set forth below in connection with the appended drawings is intended as a description of certain embodiments of the present disclosure, and is not intended to represent the only forms that may be developed or utilized. The description sets forth the various functions in connection with the illustrated embodiments, but it is to be understood, however, that the same or equivalent functions may be accomplished by different embodiments that are also intended to be encompassed within the scope of the present disclosure.

The method for adaptively regulating a coding mode and the digital correction circuit thereof according to the present disclosure can be applicable to any SAR ADC. In brief, the present disclosure is not limited to how a SAR ADC is implemented.

Figure 1:
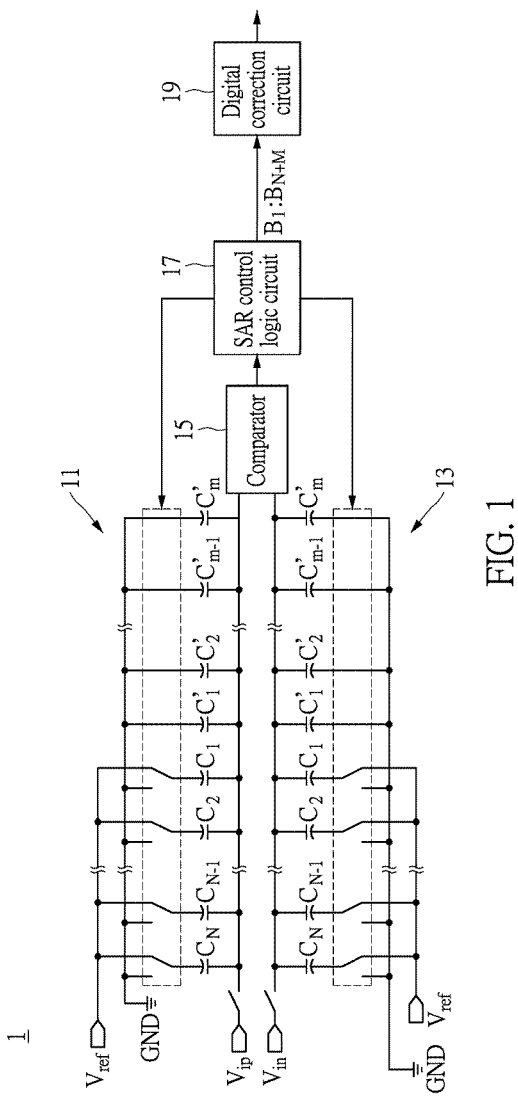
FIG. 1 is a schematic diagram of a SAR ADC according to one embodiment of the present disclosure.

For example, referring to FIG. 1, FIG. 1 is a schematic diagram of a SAR ADC according to one embodiment of the present disclosure. The SAR ADC 1 includes two symmetric capacitor arrays 11 and 13, a comparator 15, a SAR control logic circuit 17 and a digital correction circuit 19. The capacitor array 11 is switchably electrically connected to a positive analog input voltage terminal Vip, and the capacitor array 13 is switchably electrically connected to a negative analog input voltage terminal Vin.

Furthermore, each of the capacitor arrays 11 and 13 includes, respectively, N switching capacitors $C_1 \sim C_N$ and M redundant capacitors $C'_1 \sim C'_M$ that are connected in parallel. The redundant capacitors $C'_1 \sim C'_M$ are electrically connected to a grounding terminal GND, while the switching capacitors $C_r \sim C_N$ are switchably electrically connected to a reference voltage Vref or a grounding terminal GND. However, to achieve binary weighted switching, the capacities of the switching capacitors $C_1 \sim C_N$ are arranged in ascending powers of 2 (for example, 1C, 2C, 4C, 8C, etc.). Moreover, each of the capacities of the redundant capacitors $C'_1 \sim C'_M$ is equal to the capacity of the switching capacitor $C_1$ that has the smallest capacity (i.e., 1C). The capacitor arrays 11 and 13 are provided to achieve sample and hold (S/H) and digital-to-analog conversion. More particularly, N is a positive integer larger than 1, and M is a positive integer larger than 1.

Then, the comparator 15 includes two input terminals configured to receive the output of the capacitor arrays 11 and 13, respectively. The SAR control logic circuit 17 is configured to sequentially analyze corresponding digital bits $B_1 \sim B_{N+M}$ according to the output result of the comparator 15, and sequentially control the switching contacts of the switching capacitors $C_1 \sim C_N$ in each of the capacitor arrays 11 and 13 based on the binary search algorithm so that the outputs of the capacitor arrays 11 and 13 successively approach to each other. Finally, the digital correction circuit 19 is coupled to the SAR control logic circuit 17 and is configured to process the digital bits $B_1 \sim B_{N+M}$ according to a conventional coding rule to provide a digital output code including N bits. It should be noted that the SAR ADC 1 is known to persons with ordinary skill in the art and thus detailed descriptions of the elements previously stated are not repeated herein.

In summary, the SAR ADC 1 is capable of converting an analog signal to a relatively correct digital output code only after the SAR control logic circuit 17 has successfully completed (N+M) comparison cycles (in other word, the SAR control logic circuit 17 has to correspondingly analyze a digital bit sequence $[B_1:B_{N+M}]$). However, as previously stated, due to PVT variations, the SAR control logic circuit 17 may not complete the $(N+M)^{th}$ comparison cycle within a given time period, which results in an incorrect digital output code. Accordingly, the conventional art is limited by the foregoing problem.

Figure 2:
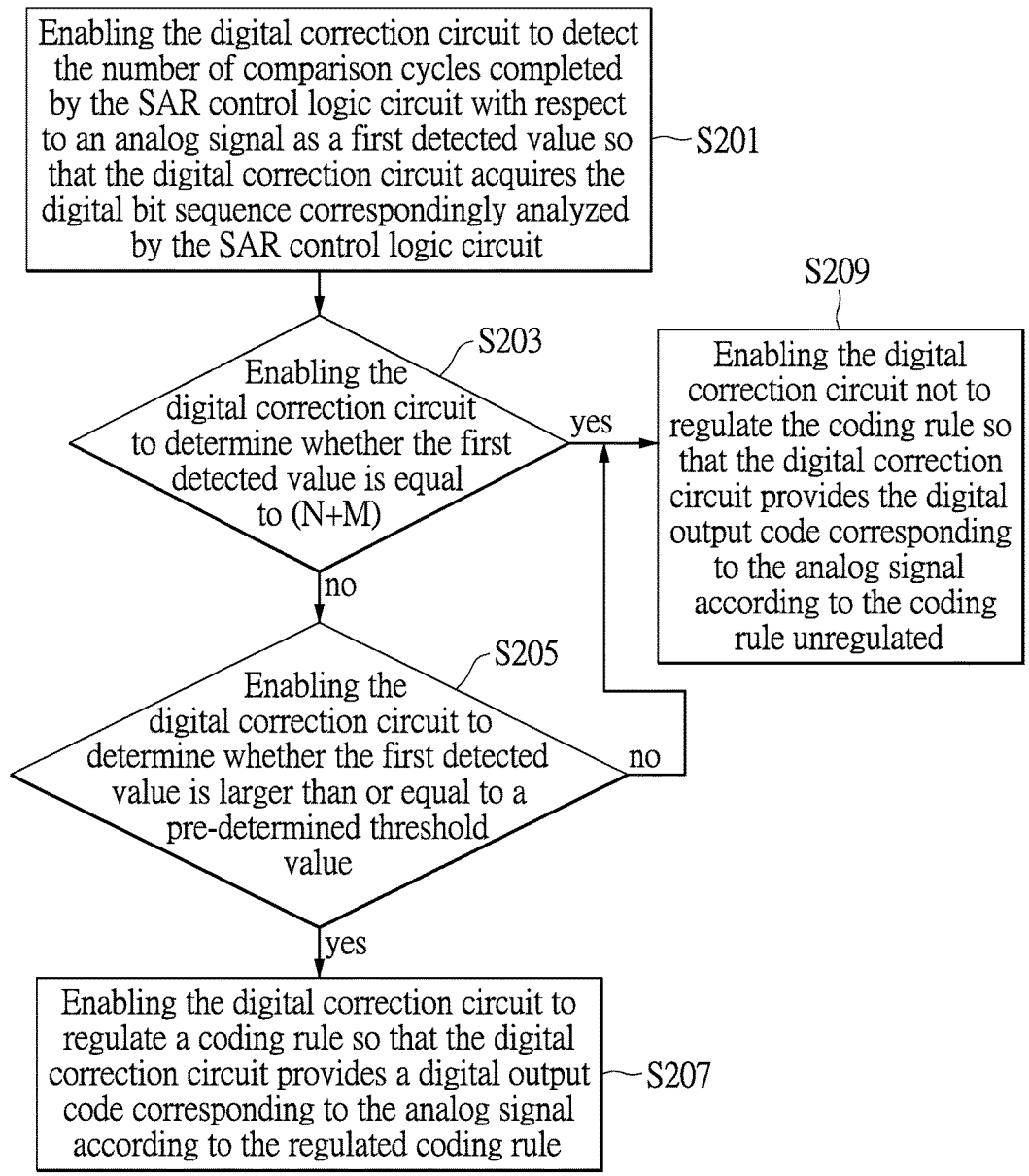
FIG. 2 is a flowchart of a method for adaptively regulating a coding mode according to one embodiment of the present disclosure.

Therefore, referring to FIG. 2, FIG. 2 is a flowchart of a method for adaptively regulating a coding mode according to one embodiment of the present disclosure. It should be noted that the method in FIG. 2 is applicable to the SAR ADC 1 in FIG. 1. Please also refer to FIG. 1 for better understanding. However, the present disclosure is not limited thereto.

First, in Step S201, the digital correction circuit 19 detects the number of comparison cycles completed by the SAR control logic circuit 17 with respect to an analog signal as a first detected value K so that the digital correction circuit 19 acquires the digital bit sequence correspondingly analyzed by the SAR control logic circuit 17. Moreover, in Step S203, the digital correction circuit 19 determines whether the first detected value K is equal to (N+M).

Then, in Step S205, the digital correction circuit 19 determines whether the first detected value K is larger than or equal to a pre-determined threshold value if the first detected value K is not equal to (N+M). Finally, in Step S207, the digital correction circuit 19 regulates a coding rule so that the digital correction circuit 19 provides a digital output code corresponding to the analog signal according to the regulated coding rule if the first detected value K is larger than or equal to the pre-determined threshold value.

More particularly, since the SAR control logic circuit 17 is capable of counting the number of completed comparison cycles, Step S201 in the method according to the present disclosure enables the digital correction circuit 19 to acquire the number of comparison cycles completed by the SAR control logic circuit 17 with respect to an analog signal by detecting the counted value of the SAR control logic circuit 17.

Then, the actual number of digital bits analyzed by the SAR control logic circuit 17 can be evaluated according to the acquired number of comparison cycles completed (i.e., the first detected value K). For example, in Step S201, the digital correction circuit 19 only acquires the digital bits $B_1 \sim B_6$ analyzed by the SAR control logic circuit 17 if the first detected value K is 6.

Moreover, as previously stated, the digital correction circuit 19 is capable of processing the digital bit sequence $[B_1:B_{N+M}]$ based on the conventional coding rule to provide the correct digital output code only after the SAR control logic circuit 17 has successfully completed (N+M) comparison cycles. Therefore, one of the aspects of the present disclosure is to enable the digital correction circuit 19 to determine whether to regulate the coding rule by detecting the number of comparison cycles completed by the SAR control logic circuit 17 so as to prevent the digital correction circuit 19 from using an inadequate coding rule to provide an incorrect digital output code.

On the other hand, if the first detected value K is equal to (N+M), it indicates that the SAR control logic circuit 17 has successfully completed (N+M) comparison cycles. Therefore, the digital correction circuit 19 can directly process the digital bit sequence $[B_1:B_{N+M}]$ based on the conventional coding rule to provide a correct digital output code. Therefore, returning to FIG. 2, if the first detected value K is equal to (N+M), Step S209 in the method of the present disclosure can be conducted to enable the digital correction circuit 19 not to regulate the coding rule so that the digital correction circuit 19 provides the digital output code corresponding to the analog signal according to the unregulated coding rule.

Moreover, from a more general point of view, if the first detected value K is smaller than a pre-determined threshold value (for example, N), it indicates that the SAR control logic circuit 17 can only complete a very small number of comparison cycles. Therefore, whether or not the digital correction circuit 19 regulates the conventional coding rule, the SAR ADC 1 may fail to provide the correct digital output code. In view of the above problem, the method of the present disclosure will not emphasize further research or investigations thereof. Therefore, if the first detected value K is smaller than a pre-determined threshold value, the teachings of the present disclosure can still be used in Step S209. In summary, the present disclosure is not limited to any implementation when the first detected value K is smaller than a pre-determined threshold value. Persons with ordinary skill in the art may make any modifications according to practical demands or applications. Moreover, a detailed description on how the pre-determined threshold value is defined will be presented herein.

According to the teachings stated above, persons with ordinary skill in the art should understand that one of the aspects of the present disclosure is to dynamically regulate the coding rule of the digital correction circuit 19 by detecting the number of comparison cycles completed by the SAR control logic circuit 17 so that the digital correction circuit 19 may use an adequate coding rule to provide a correct digital output code. Accordingly, the output result of the SAR ADC 1 stays correct under ideal conditions (i.e., when (N+M) comparison cycles successfully completed).

Figure 3:
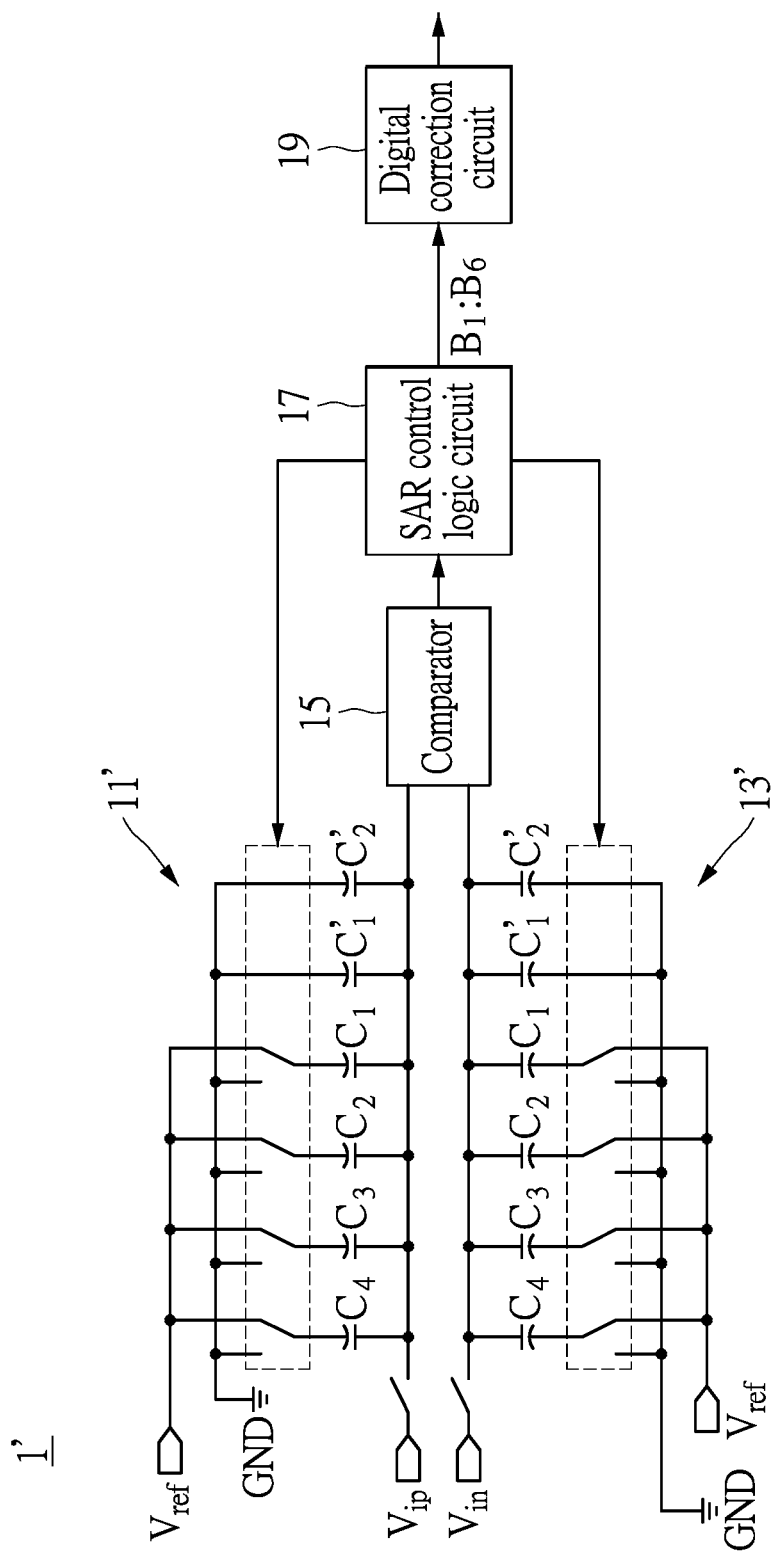
FIG. 3 is a schematic diagram of a SAR ADC according to another embodiment of the present disclosure.

Another example will be presented to further exemplify how the coding rule of the digital correction circuit is regulated to provide a correct digital output code in an adaptive regulating coding method provided by the present disclosure. Referring to FIG. 3, FIG. 3 is a schematic diagram of a SAR ADC according to another embodiment of the present disclosure. Some elements in FIG. 3 identical to the elements in FIG. 1 are labeled in the same way as in FIG. 1, and thus descriptions thereof are not repeated herein. Compared to the SAR ADC 1 in FIG. 1, two capacitor arrays 11' and 13' of the SAR ADC 1' in FIG. 3 include, respectively, 4 switching capacitors C1~C4 and 2 redundant capacitors C'1~C'2 that are connected in parallel. In other words, the parameter N is 4, and the parameter M is 2.

Therefore, according to the teachings stated above, persons with ordinary skill in the art would understand that, in the SAR ADC 1', the digital correction circuit 19 is capable of processing the digital bit sequence [B₁:B₆] based on the conventional coding rule to provide the 4-bit digital output code only after the SAR control logic circuit 17 has to complete 6 comparison cycles. However, due to PVT variations, the digital correction circuit 19 can actually acquire only the digital bits $B_1$~$B_5$ while the SAR control logic circuit 17 can complete only 5 comparison cycles. Therefore, the digital correction circuit 19 will provide an incorrect 4-bit digital output code if the digital correction circuit 19 in FIG. 3 processes the digital bit sequence [B₁:B₆] based on the conventional coding rule.

For example, as known from the conventional art, the processing of the digital bit sequence [B₁:B₆] based on the conventional coding rule uses the binary weighted ratio with respect to 6 (i.e., (N+M)) comparison cycles (for example, the weighting of the $6^{th}$ digital bit $B_6$ is set to be 1, the weighting of the $5^{th}$ digital bit $B_5$ is set to be 2, etc.) to encode the digital bit sequence [B₁:B₆]. However, since the $6^{th}$ digital bit $B_6$ in the digital bit sequence [B₁:B₆] cannot be analyzed, (in other words, the $6^{th}$ digital bit $B_6$ may not even exist), the digital output code [1, 2, 3, 4] which the digital correction circuit 19 should provide may be replaced by an incorrect digital output code [0, 2, 2, 4]. It should be noted that encoding the digital bit sequence using the binary weighted ratio is known to persons with ordinary skill in the art, and thus descriptions thereof are not repeated herein.

Returning to FIG. 3, since the capacities of the last two redundant capacitors $C'_1$~$C'_2$ in the capacitor arrays 11' and 13' are both 1C, persons with ordinary skill in the art would understand that the SAR control logic circuit 17 only omits executing the switching on the last capacitor with a capacity of 1C when the SAR control logic circuit 17 in FIG. 3 completes 5 comparison cycles. Therefore, the method of the present disclosure can control the digital correction circuit 19 in FIG. 3 to use the binary weighted ratio with respect to 5 comparison cycles (for example, the weighting of the $6^{th}$ digital bit $B_6$ is set to be 0, the weighting of the $5^{th}$ digital bit $B_5$ is set to be 1, etc.) to encode the digital bit sequence [B₁:B₆] to provide a first coding sequence [0, 1, 2, 3] including N elements and add 1 to each element in the first coding sequence [0, 1, 2, 3] (to compensate the omitted switching on the last capacitor with a capacity of 1C) to provide the digital output code corresponding to the analog signal. Accordingly, the digital correction circuit 19 can provide the digital output code [1, 2, 3, 4] so that the output result stays correct under ideal conditions (i.e., when 6 comparison cycles are successfully completed).

Similarly, when the SAR control logic circuit 17 in FIG. 3 only completes 4 comparison cycles (i.e., both the $5^{th}$ digital bit $B_5$ and the $6^{th}$ digital bit $B_6$ cannot be analyzed), the method of the present disclosure can control the digital correction circuit 19 in FIG. 3 to use the binary weighted ratio with respect to 4 comparison cycles (for example, both the weighting of the $6^{th}$ digital bit $B_6$ and the weighting of the $5^{th}$ digital bit $B_5$ are set to be 0, the weighting of the $4^{th}$ digital bit $B_4$ is set to be 1, etc.) to encode the digital bit sequence [B₁:B₆] to provide a first coding sequence including N elements and add 2 to each element in the first coding sequence (to compensate the omitted switching on the last two capacitors with a capacity of 1C) to provide the correct digital output code [1, 2, 3, 4].

Therefore, according to the teachings stated above, persons with ordinary skill in the art would understand that the method of the present disclosure determines whether to regulate the binary weight corresponding to the digital bits according to the number of completed comparison cycles (i.e., the first detected value K) to encode the digital bit sequence to provide a first coding sequence. Then, the first coding sequence is compensated with respect to the uncompleted comparison cycle to provide the correct digital output code. Accordingly, the output result stays correct under different numbers of comparison cycles completed by the SAR ADC.

Figure 4:
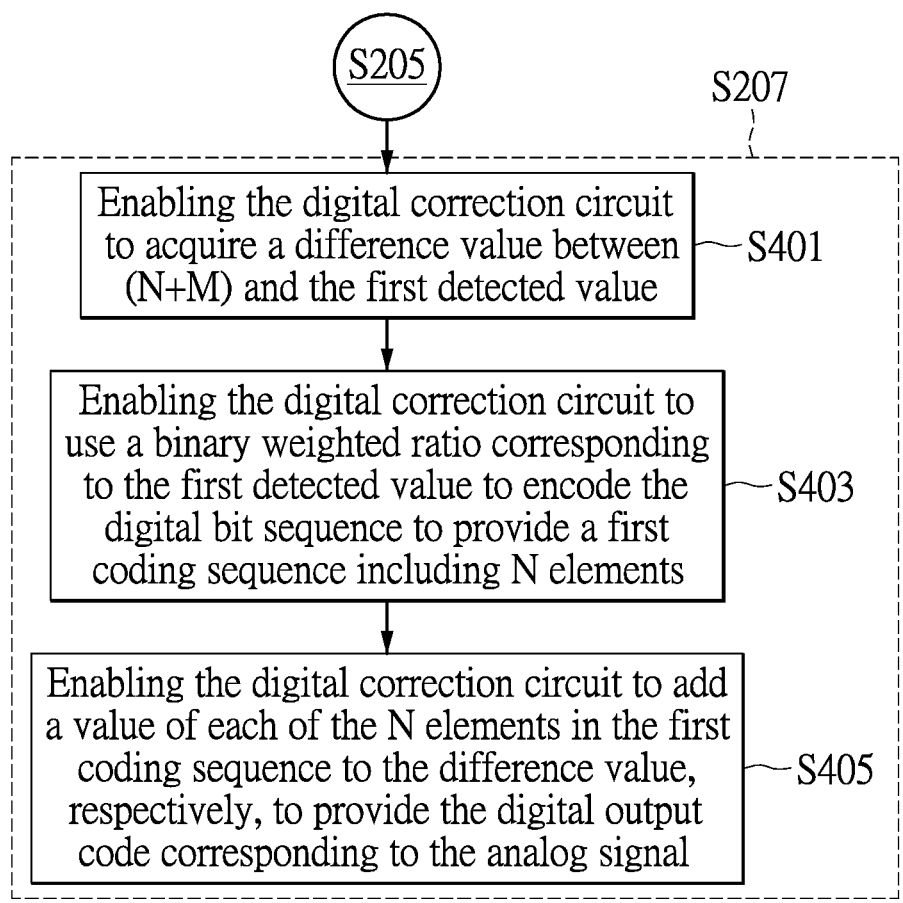
FIG. 4 is a flowchart of regulating a coding rule for a digital correction circuit according to one embodiment of the present disclosure to provide a digital output code.

Based on the teachings stated above, the present disclosure further provides implementations of Step S207. Referring to FIG. 4, FIG. 4 is a flowchart of regulating a coding rule for a digital correction circuit according to one embodiment of the present disclosure to provide a digital output code. Steps in FIG. 4 identical to the steps in FIG. 2 are labeled in the same way as in FIG. 2, and thus descriptions thereof are not repeated herein.

Referring to FIG. 1, FIG. 2 and FIG. 4, Step S207 further includes Step S401~Step S405. First, in Step S401, the digital correction circuit 19 acquires a difference value between (N+M) and the first detected value. Then, in Step S403, the digital correction circuit 19 uses a binary weighted ratio corresponding to the first detected value K to encode the digital bit sequence to provide a first coding sequence including N elements. Finally, in Step S405, the digital correction circuit 19 adds the value of each of the N elements in the first coding sequence to the difference value, respectively, to provide the digital output code corresponding to the analog signal. It should be noted that, in Step S401, the acquired difference value can be regarded as the number R of comparison cycles uncompleted by the SAR control logic circuit 17 with respect to the analog signal.

On the other hand, as shown in FIG. 1, the capacity of each of the redundant capacitors $C'_1$~$C'_M$ is 1C. For the uncompleted comparison cycles, when the SAR control logic circuit 17 only omits executing the switching on the last R capacitor(s) with a capacity of 1C, Step S405 enables the digital correction circuit 19 to add a value of each of the elements in the first coding sequence to the difference value, respectively, (to compensate the omitted switching on the last R capacitor(s) with a capacity of 1C). In other words, R is any positive integer within a range from 1 to M. Therefore, the pre-determined threshold value in Step S205 is a positive integer larger than or equal to N (i.e., the number of the switching capacitors C1~CN) and smaller than (N+M).

Practically, the pre-determined threshold value in the method of the present disclosure can be set to be N to broaden the applications of adaptive regulation, to which the present disclosure is not limited thereof. Furthermore, taking the SAR ADC 1' in FIG. 3 for example, when the pre-determined threshold value is set to be 4 (i.e., the number of the switching capacitors C1~C4) and the SAR control logic circuit 17 successfully completes 4 or 5 comparison cycles, the digital correction circuit 19 can use Step S401~Step S405 in FIG. 4 to make the output result of the SAR ADC 1' stay correct under ideal conditions (i.e., when 6 comparison cycles successfully completed).

Figure 5:
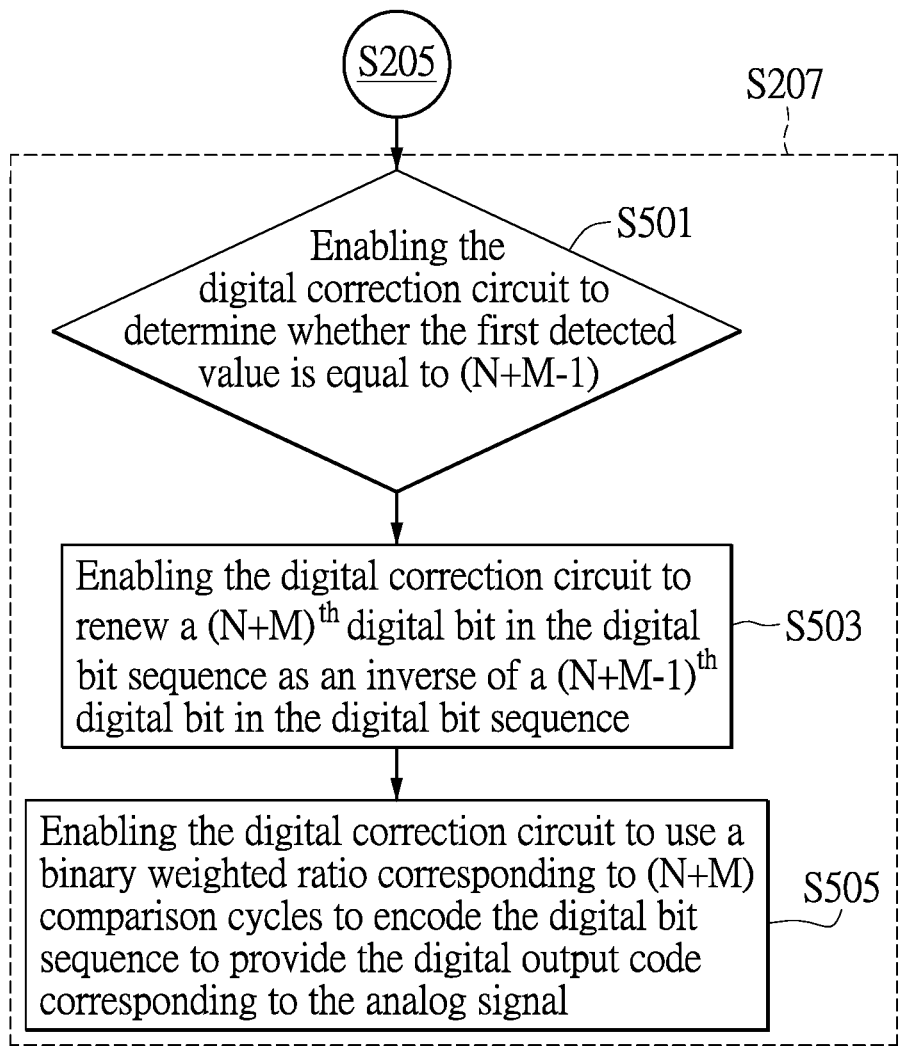
FIG. 5 is a flowchart of regulating a coding rule for a digital correction circuit according to another embodiment of the present disclosure to provide a digital output code.

Moreover, another example will be presented to further exemplify how the coding rule of the digital correction circuit is regulated to provide a correct digital output code according to the present disclosure. Referring to FIG. 5, FIG. 5 is a flowchart of regulating a coding rule for a digital correction circuit according to another embodiment of the present disclosure to provide a digital output code. Steps in FIG. 5 identical to the steps in FIG. 2 are labeled in the same way as in FIG. 2, and thus descriptions thereof are not repeated herein.

Referring to FIG. 1, FIG. 2 and FIG. 5, as previously stated, when the SAR control logic circuit 17 only completes (N+M−1) comparison cycles, it indicates that the SAR control logic circuit 17 only omits executing the switching on the last capacitor with a capacity of 1C. Therefore, compared to the steps in FIG. 4, in Step S501, if the first detected value K is larger than or equal to a pre-determined threshold value, the method of the present disclosure enables the digital correction circuit 19 to further determine whether the first detected value K is equal to (N+M−1). After that, in Step S503, if the first detected value K is equal to (N+M−1), the digital correction circuit 19 renews a (N+M)$^{th}$ digital bit in the digital bit sequence as an inverse of a (N+M−1)$^{th}$ digital bit in the digital bit sequence. Finally, in Step S505, the digital correction circuit 19 uses a binary weighted ratio corresponding to (N+M) comparison cycles to encode the digital bit sequence to provide the digital output code corresponding to the analog signal.

Taking the SAR ADC 1' in FIG. 3 for example, when the SAR control logic circuit 17 completes only 5 (i.e., (N+M−1)) comparison cycles, the method of the present disclosure renews the 6$^{th}$ digital bit $B_6$ in the digital bit sequence $[B_1:B_6]$ as an inverse of a 5$^{th}$ digital bit in the digital bit sequence, and uses a binary weighted ratio with respect to 6 comparison cycles to encode the renewed digital bit sequence $[B_1:B_6]$ to provide the correct digital output code [1, 2, 3, 4].

Figure 6:
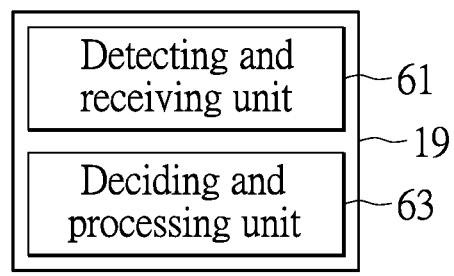
FIG. 6 is a functional block diagram of a digital correction circuit according to one embodiment of the present disclosure.

In order to describe the flowchart of the adaptive regulating coding method, the present disclosure further provides a digital correction circuit. Referring to FIG. 6, FIG. 6 is a functional block diagram of a digital correction circuit according to one embodiment of the present disclosure. However, the description of the digital correction circuit 19 is only an example of implementing the method, to which the present disclosure is not limited. It should be noted that the digital correction circuit 19 in FIG. 6 is applicable to the SAR ADC 1 in FIG. 1. Please refer to FIG. 1 for better understanding.

More particularly, the digital correction circuit 19 includes a detecting and receiving unit 61 and a deciding and processing unit 63. These units can be implemented by hardware circuitry, or by hardware circuitry with firmware or with software. In summary, the present disclosure is not limited to the example of the digital correction circuit 19. Moreover, the detecting and receiving unit 61 and the deciding and processing unit 63 can be integrated or disposed separately, to which the present disclosure is not limited.

Furthermore, the detecting and receiving unit 61 is configured to detect a number of comparison cycles completed by the SAR control logic circuit 17 with respect to an analog signal as a first detected value K. The detecting and receiving unit 61 is configured to acquire the digital bit sequence correspondingly analyzed by the SAR control logic circuit 17.

The deciding and processing unit 63 is configured to determine whether the first detected value K is equal to (N+M) to determine whether the first detected value K is larger than or equal to a pre-determined threshold value if the first detected value K is not equal to (N+M). The deciding and processing unit 63 regulates a coding rule to provide a digital output code corresponding to the analog signal according to the regulated coding rule if the first detected value K is larger than or equal to the pre-determined threshold value.

It should be noted that the deciding and processing unit 63 is capable of executing the steps in FIG. 4 or FIG. 5 to regulate the coding rule of the digital correction circuit to provide the digital output code. Please refer to FIG. 4 and FIG. 5 for better understanding, and detailed descriptions thereof are not repeated herein.

As previously stated, the present disclosure provides a method for adaptively regulating a coding mode and a digital correction circuit thereof. The coding rule of the digital correction circuit is dynamically regulated according to the detected number of comparison cycles completed by the SAR control logic circuit so that the digital correction circuit uses an adequate coding rule to provide a correct digital output code. Thereby, under different PVT variations, the SAR ADC effectively eliminates the conversion time variations due to PVT variations to obtain a correct output result with different numbers of completed comparison cycles.

The above-mentioned descriptions represent merely the exemplary embodiment of the present disclosure, without any intention to limit the scope of the present disclosure thereto. Various equivalent changes, alterations or modifications based on the claims of the present disclosure are all consequently viewed as being embraced by the scope of the present disclosure.

What is claimed is:

1. A method for adaptively regulating a coding mode for a successive-approximation-register analog-to-digital converter (SAR ADC), said SAR ADC comprising at least one capacitor array, a comparator, a SAR control logic circuit and a digital correction circuit, said capacitor array comprising N switching capacitors and M redundant capacitors that are connected in parallel, said SAR control logic circuit being configured to correspondingly analyze a digital bit sequence sequentially according to an output result of said comparator, and said method comprising:
    (a) enabling said digital correction circuit to detect the number of comparison cycles completed by said SAR control logic circuit with respect to an analog signal as a first detected value so that said digital correction circuit acquires said digital bit sequence correspondingly analyzed by said SAR control logic circuit;
    (b) enabling said digital correction circuit to determine whether said first detected value is equal to (N+M), and enabling said digital correction circuit to determine whether said first detected value is larger than or equal to a pre-determined threshold value if said first detected value is not equal to (N+M); and
    (c) enabling said digital correction circuit to regulate a coding rule so that said digital correction circuit provides a digital output code corresponding to said analog signal according to said regulated coding rule if said first detected value is larger than or equal to said pre-determined threshold value;
    wherein N is a positive integer larger than 1, and M is a positive integer larger than 1.

2. The method of claim 1, wherein said pre-determined threshold value is a positive integer larger than or equal to N and smaller than (N+M).

3. The method of claim 1, wherein said digital correction circuit does not regulate said coding rule so that said digital correction circuit provides said digital output code corresponding to said analog signal according to said coding rule unregulated if said first detected value is equal to (N+M).

4. The method of claim 1, wherein step (c) comprises:
    enabling said digital correction circuit to acquire a difference value between (N+M) and said first detected value;
    enabling said digital correction circuit to use a binary weighted ratio corresponding to said first detected value to encode said digital bit sequence to provide a first coding sequence comprising N elements; and enabling said digital correction circuit to add a value of each of said N elements in said first coding sequence to said difference value, respectively, to provide said digital output code corresponding to said analog signal.

5. The method of claim 1, wherein step (c) comprises:
enabling said digital correction circuit to determine whether said first detected value is equal to (N+M−1);
enabling said digital correction circuit to renew a $(N+M)^{th}$ digital bit in said digital bit sequence as an inverse of a $(N+M-1)^{th}$ digital bit in said digital bit sequence if said first detected value is equal to (N+M−1); and
enabling said digital correction circuit to use a binary weighted ratio corresponding to (N+M) comparison cycles to encode said digital bit sequence to provide said digital output code corresponding to said analog signal.

6. A digital correction circuit for adaptively regulating a coding mode for a successive-approximation-register analog-to-digital converter (SAR ADC), said SAR ADC comprising at least one capacitor array, a comparator and a SAR control logic circuit, said capacitor array comprising N switching capacitors and M redundant capacitors that are connected in parallel, said SAR control logic circuit being configured to correspondingly analyze a digital bit sequence sequentially according to an output result of said comparator, and said digital correction circuit comprising:
a detecting and receiving unit configured to detect the number of comparison cycles completed by said SAR control logic circuit with respect to an analog signal as a first detected value to acquire said digital bit sequence correspondingly analyzed by said SAR control logic circuit; and
a deciding and processing unit configured to determine whether said first detected value is equal to (N+M), to determine whether said first detected value is larger than or equal to a pre-determined threshold value if said first detected value is not equal to (N+M), and to regulate a coding rule to provide a digital output code corresponding to said analog signal according to said regulated coding rule if said first detected value is larger than or equal to said pre-determined threshold value;
wherein N is a positive integer larger than 1, and M is a positive integer larger than 1.

7. The digital correction circuit of claim 6, wherein said pre-determined threshold value is a positive integer larger than or equal to N and smaller than (N+M).

8. The digital correction circuit of claim 6, wherein said deciding and processing unit does not regulate said coding rule so that said deciding and processing unit provides said digital output code corresponding to said analog signal according to said coding rule unregulated if said first detected value is equal to (N+M).

9. The digital correction circuit of claim 6, wherein said deciding and processing unit is configured to:
acquire a difference value between (N+M) and said first detected value;
use a binary weighted ratio corresponding to said first detected value to encode said digital bit sequence to provide a first coding sequence comprising N elements; and
add a value of each of said N elements in said first coding sequence to said difference value, respectively, to provide said digital output code corresponding to said analog signal.

10. The digital correction circuit of claim 6, wherein said deciding and processing unit is configured to:
determine whether said first detected value is equal to (N+M−1);
renew a $(N+M)^{th}$ digital bit in said digital bit sequence as an inverse of a $(N+M-1)^{th}$ digital bit in said digital bit sequence if said first detected value is equal to (N+M−1); and
use a binary weighted ratio corresponding to (N+M) comparison cycles to encode said digital bit sequence to provide said digital output code corresponding to said analog signal.

* * * * *